(12) United States Patent
Kim et al.

(10) Patent No.: US 10,892,436 B2
(45) Date of Patent: Jan. 12, 2021

(54) NARROW BEZEL ELECTROLUMINANCE LIGHTING DEVICE

(71) Applicant: LG Display Co., Ltd., Seoul (KR)

(72) Inventors: JongMin Kim, Paju-si (KR); Seunghyun Youk, Paju-si (KR); Youngkyun Moon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/726,660

(22) Filed: Dec. 24, 2019

(65) Prior Publication Data

US 2020/0212344 A1 Jul. 2, 2020

(30) Foreign Application Priority Data

Dec. 28, 2018 (KR) .................... 10-2018-0172854

(51) Int. Cl.
*H01L 51/52* (2006.01)

(52) U.S. Cl.
CPC ........ *H01L 51/5212* (2013.01); *H01L 51/524* (2013.01); *H01L 51/5253* (2013.01); *H01L 2251/533* (2013.01); *H01L 2251/5361* (2013.01)

(58) Field of Classification Search
CPC ............... H01L 51/5212; H01L 51/524; H01L 51/5253; H01L 2251/533; H01L 2251/5361

USPC .......................................................... 257/40
See application file for complete search history.

(56) References Cited

U.S. PATENT DOCUMENTS 9,626,063 B2 * 4/2017 Choi ....................... H01L 51/56

FOREIGN PATENT DOCUMENTS

| KR | 2001-0062489 A | 7/2001 |
| KR | 2003-0030380 A | 4/2003 |

* cited by examiner

*Primary Examiner* — Tu-Tu V Ho
(74) *Attorney, Agent, or Firm* — Polsinelli PC

(57) ABSTRACT

An electroluminescent lighting device comprises a substrate including an emission area and a non-emission area surrounding the emission area; an auxiliary line disposed at the emission area and defining a pixel area; a lower pad extended from the auxiliary line and disposed at one side of the non-emission area; an anode layer covering the auxiliary line and the lower pad; an emission layer disposed on the anode layer in the emission area; a cathode layer disposed on the emission layer; a second pad extended from the cathode layer and disposed at another side of the non-emission area; an encapsulation layer covering the emission area on the cathode layer; a cover film attached on the encapsulation layer and having a first pad corresponding to the lower pad; and a conductive adhesive electrically connecting the first pad and the lower pad.

20 Claims, 4 Drawing Sheets

NARROW BEZEL ELECTROLUMINANCE LIGHTING DEVICE

CROSS REFERENCE TO RELATED APPLICATION

This application claims the benefit of the Korean Patent Application No. 10-2018-0172854 filed on Dec. 28, 2018, which is hereby incorporated by reference in its entirety.

BACKGROUND

Field of the Disclosure

The present disclosure relates to an electroluminescent lighting device. Especially, the present disclosure relates to a narrow bezel electroluminescent lighting device having an organic light emitting element.

Description of the Background

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is necessary to have a robust structure against the foreign materials such as moisture and oxygen which can penetrate from the outside according to its applied environment. In addition, due to the loss of light amount occurred in the organic light emitting element itself, the luminescent efficiency may be degraded. Therefore, in order to apply the organic light emitting element to the lighting device, it is necessary to develop a structure that protects the element from the external environment and improve the luminescence efficiency and the aperture ratio.

SUMMARY

The present disclosure, as for solving the problems described above, provides an electroluminescent lighting device having a narrow bezel structure by minimizing the width of the routing line. Another aspect of the present disclosure provides an electroluminescent lighting device in which the back surface of the cover film is used as the routing line so that the uniformity of the brightness is enhanced and the emission area is maximized.

For the aspects above mentioned, the present disclosure provides an electroluminescence light device comprising: a substrate including an emission area and a non-emission area surrounding the emission area; an auxiliary line disposing at the emission area to defining a pixel area; a lower pad extended from the auxiliary line and disposed at one side of the non-emission area; an anode layer covering the auxiliary line and the lower pad; an emission layer disposed on the anode layer in the emission area; a cathode layer disposed on the emission layer; a second pad extended from the cathode layer and disposed at another side of the non-emission area; an encapsulation layer covering the emission area on the cathode layer; a cover film attached on the encapsulation layer and including a first pad corresponding to the lower pad; and a conductive adhesive electrically connecting the first pad to the lower pad.

In one aspect, the electroluminescent lighting device further comprises: a plurality of link contact holes disposed at the non-emission area not having the lower pad, and exposing the anode layer, wherein the conductive adhesive is applied to the plurality of the line contact holes to electrically connect the anode layer and the cover film.

In one aspect, the first pad is disposed at middle portions of the one side of the cover film, and the second pad is disposed at middle portions corresponding to the first pad on the substrate.

In one aspect, the electroluminescent lighting device further comprises: a flexible circuit board including: a first pad terminal connected to the first pad; a second pad terminal connected to the second pad; and a driving device connected to the first pad terminal and the second pad terminal.

In one aspect, the anode layer includes: a power line contacting and covering the auxiliary line; a first electrode connected to the power line and formed in the pixel area; and a link electrode having a rod shape connecting the first electrode to the power line.

In one aspect, the electroluminescent lighting device further comprises: a passivation layer, wherein the passivation layer is disposed on the anode layer and covers the power line and the link electrode, and wherein the passivation layer defines a pixel emitting area by covering circumferences of the first electrode and exposing middle portions of the first electrode.

In one aspect, an emission element is configured with the first electrode, the emission layer and the cathode layer stacked in the pixel emitting area.

In one aspect, the first pad is disposed at one end of the one side of the non-emission area, and the second pad is disposed at another end of the one side of the non-emission area as being separated from the first pad with a predetermined distance.

In one aspect, the first pad is disposed at a middle portion of the one side of the non-emission area, and the second pad is disposed at both sides of the first pad at the one side of the non-emission area.

In one aspect, the electroluminescent lighting device further comprises: a non-conductive adhesive disposed at the emission area for attaching the encapsulation layer to the cover film.

The electroluminescent lighting device according to the present disclosure has a new structure in which the routing line is not disposed as surrounding the emission area, but the back surface of the cover film is used for the routing line. As the routing line for supplying the power voltage has the surface structure not the line structure, the resistance of the routing lines for supplying the electric power voltage can be minimized and maintain in the uniformity value. Therefore, the brightness can be uniformly distributed over the whole surface of the emission area. In addition, the narrow bezel structure can be acquired by minimizing the area for disposing the routing line so that the emission area can be maximized. The electroluminescent lighting device according to the present disclosure can be configured with various structures of the terminals by that any one of the driving terminal pad for receiving the driving voltage and the common pad for receiving the common voltage is disposed on the substrate and the other of them is disposed on the cover film. Therefore, it is very suitable for the flexible lighting device in which flexibility is highly required.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.
In the drawings.

DETAILED DESCRIPTION OF THE DISCLOSURE

Figure 1:
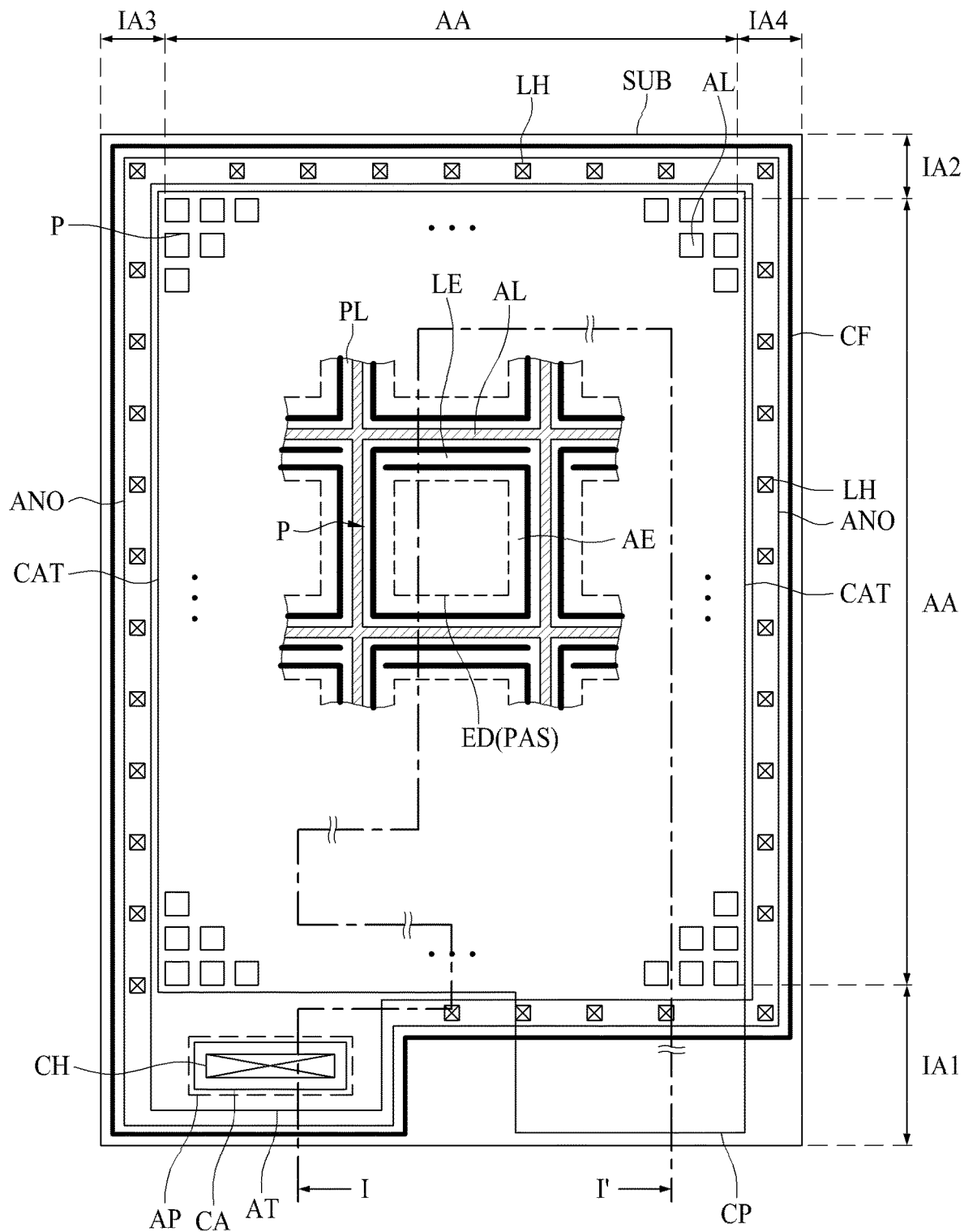
FIG. 1 is a plan view illustrating an electroluminescent lighting device according to one aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the Figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the Figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Figure 2:
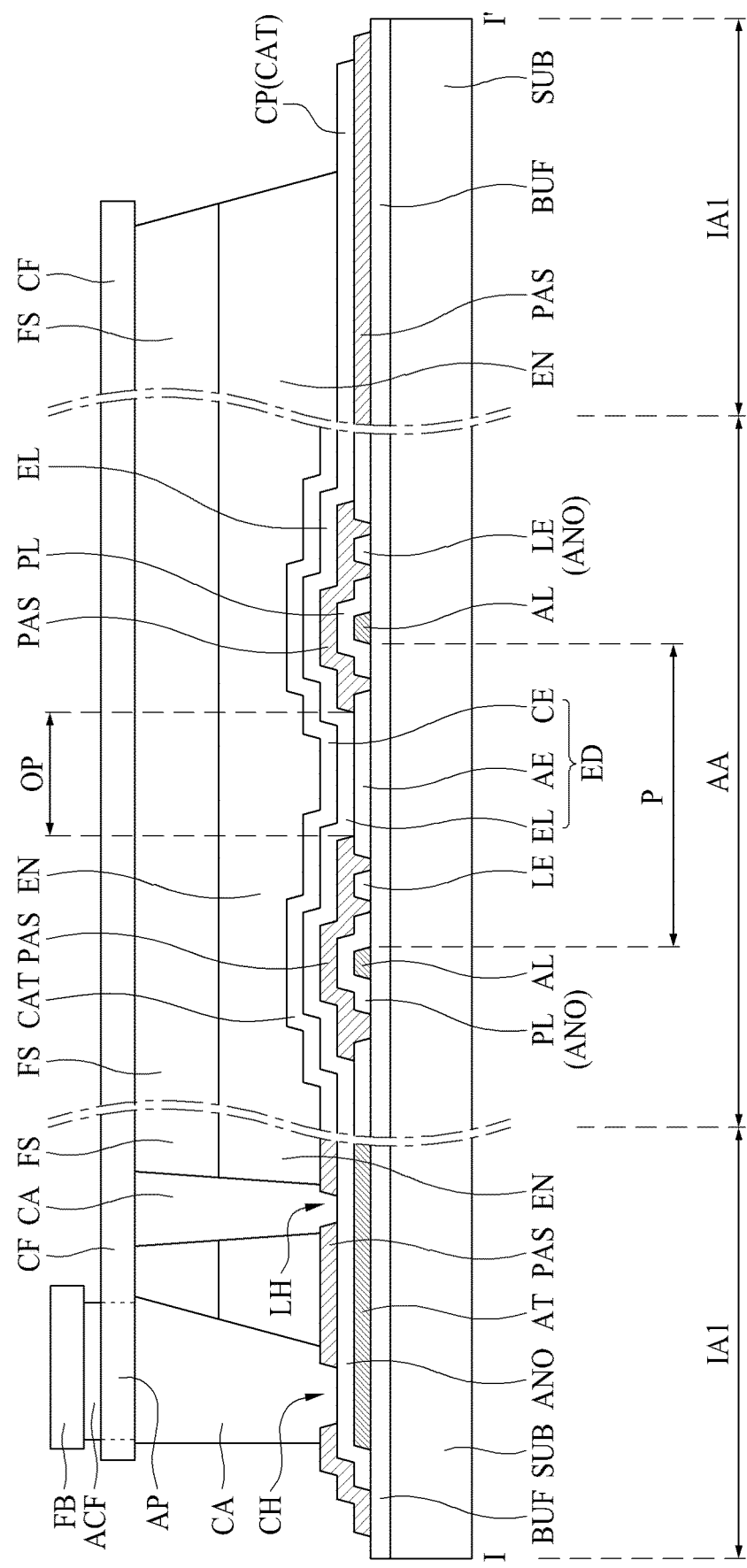
FIG. 2 is a cross-sectional view, taken along the cutting line I-I' in FIG. 1, illustrating a structure of an electroluminescent lighting device according to the present disclosure.

Hereinafter, referring to FIGS. 1 and 2, an electroluminescent lighting device according to the first aspect of the present disclosure will be explained. FIG. 1 is a plan view illustrating an electroluminescent lighting device according to one aspect of the present disclosure. FIG. 2 is a cross-sectional view, taken along the cutting line I-I' in FIG. 1, illustrating a structure of an electroluminescent lighting device according to one aspect of the present disclosure. In this aspect, the lighting device is an organic luminance lighting device, but it is not limited thereto.

Referring to FIGS. 1 and 2, the electroluminescent lighting device according to the present disclosure comprises a substrate SUB, an auxiliary line AL, an anode layer ANO, a cathode layer CAT, an emission element ED, a first pad AP, a second pad CP, a cover film CF and a conductive adhesive CA.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB which may be made of glass material may be a thinned glass substrate having a thickness of 100 micrometer or less, or may be etched glass substrate to have a thickness of 100 micrometer or less.

The lighting device may have various shapes and the properties suitable for the functional purposes. Therefore, the substrate SUB may have the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, the substrate SUB, in a plan view, may have a rectangular shape, a rounded rectangular shape in which each corner is rounded with a certain radius of curvature, a non-square shape having at least 5 sides, a circular shape or an elliptical shape. As determining the shape and size of the lighting device, the substrate SUB may have various shapes such as an elongated rectangle, a regular rectangle, a rhombus, and a polygon.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape or non-rectangular shape having at least 5 sides. The emission area AA may have the same shape as the substrate SUB, but is not necessarily. The emission area AA may have the different shape from that of the substrate SUB for the manufacturing purposes and/or the functional requirements.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

A buffer layer BUF may be deposited on the whole surfaces of the substrate SUB. The buffer layer BUF is the element for preventing the foreign materials such as moisture or oxygen from intruding into the emission element ED. For example, the buffer layer BUF may include a plurality of inorganic layers in which different inorganic materials are alternately stacked each other. In one example, the buffer layer BUF may include a multiple layers in which two or more inorganic layers of any one of the silicon oxide (SiOx) layer, the silicon nitride (SiNx) layer and the silicon oxynitride (SiON) layer are alternatively stacked. The buffer layer BUF may have at least two of organic layer and inorganic layer stacked alternately each other.

The auxiliary line AL is formed on the buffer layer BUF. Especially, the auxiliary line AL may be arranged as being a grid pattern or a strip pattern. As FIG. 1 shows that the auxiliary line AL is patterned as having a plurality of grids having a predetermined square area, but it is not restricted thereto. By the grid structure of the auxiliary line AL, the unit pixel area P may be defined as corresponding to the grid shape. The auxiliary line AL may be uniformly distributed within the emission area AA in order to maintain a uniform electric power voltage. The auxiliary line AL may be extended to one side of the first non-emission area IA1 to contact with a lower pad AT. The lower pad AT may be formed of the same material and on the same layer as the auxiliary line AL. Otherwise, the lower pad AT may be formed of a different material and on a different layer from the auxiliary line AL. Here, we explain for the case that the lower pad AT is made of same material and on the same layer as the auxiliary line AL as being one body.

The anode layer ANO may be deposited over the whole emission area AA as covering the auxiliary line AL with being directly contacted thereto. The lighting device shown in FIG. 2 may be the bottom emission type so that the anode layer ANO may include a transparent conductive material or a semi-transparent conductive material passing the lights. In one example, the anode layer ANO may be formed of a transparent conductive material such as indium tin oxide or indium zinc oxide. In another example, the anode layer ANO may be formed of a semi-transparent material including magnesium (Mg), silver (Ag) or an alloy of magnesium and silver (Mg—Ag).

The anode layer ANO may be disposed on the emission area AA as well as on some of the non-emission area IA. For example, the anode layer ANO may be formed as covering the lower pad AT disposed at the first non-emission area IA1. In this case, the anode layer ANO may play role for protecting the auxiliary line AL and the lower pad AT.

By patterning the anode layer ANO within the unit pixel area P defined by the auxiliary line AL, the power line PL, the link electrode LE and the first electrode AE are formed. The power line PL may cover the auxiliary line AL and each of the power line PL may be connected over the whole of the emission area AA. The first electrode AE may have a polygon shape within the unit pixel area P. The link electrode LE may have a rod shape connecting the first electrode AE to the power line PL. The link electrode LE may be a pathway for the power voltage from the power line PL to the first electrode AE. As the link electrode LE is formed in a thin line shape, it may play a role of a resistance structure. That is, when the first electrode AE disposed at any one unit pixel area P has the short-circuit problem, the link electrode LE playing a role of high resistor may be broken off so that the short-circuit problem may be prevented from making any further problem to other unit pixel areas P.

The passivation layer PAS may be stacked on the anode layer ANO and patterned. In particular, the passivation layer PAS may be formed as covering the power line PL and the link electrode LE, and may have a shape as to expose the most of middle area of the first electrode AE. That is, the passivation layer PAS may cover the circumference areas of the first electrode AE and expose the middle areas to define the shape and the size of the emission element ED. The shape and the size of the exposed area from the first electrode AE disposed within the unit pixel area P may be defined as the open area OP (or an emitting area) of the pixel. In this application, "emission area" AA means the area providing the lights over the whole lighting device, the "open area" (or "emitting area") OP means the area providing the lights within one unit pixel area P.

The passivation layer PAS may be deposited on the non-emission area IA. Especially, the passivation layer PAS may be formed on the anode layer ANO covering the lower pad AT extended from the auxiliary line AL. After that, the cathode layer CAT may be stacked thereon. Without passivation layer PAS, the anode layer ANO may be directly contacting the cathode layer CAT so that the short-circuit problem may be occurred. To prevent the short-circuit problem, the passivation layer PAS is formed on the portions of the anode layer ANO on which the cathode layer CAT may be formed later.

The emission layer EL may be deposited on the substrate SUB having the passivation layer PAS defining the emitting area OP within a single pixel area P. The emission layer EL may be formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first color light.

The cathode layer CAT may be deposited on the substrate SUB for covering the emission area AA. The cathode layer CAT may be deposited on some of the non-emission area IA as well as the emission area AA. The cathode layer CAT may have the same area as covering the emission area AA or the larger area of the emission area AA. For example, the second pad CP may be formed as extending to another side of the first non-emission area IA1.

Even though not shown in Figure, the second pad CP may further include a lower terminal formed of the same material and on the same layer as the anode layer ANO or the lower pad AT. The lower terminal may have an anode layer having an island shape separated from the anode layer ANO connected to the auxiliary line AL. Further, the lower terminal may be formed as having an island metal pattern separated from the lower pad AT and the auxiliary line AL.

The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), or a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold (Au), magnesium (Mg), calcium (Ca) and barium (Ba).

The cathode layer CAT is directly contacted the emission layer EL in face. Therefore, the first electrode AE, the emission layer EL and the cathode layer CAT are sequentially stacked in face within the open area OP or the emitting area of the pixel P defined by the passivation layer PAS. The portions of the cathode layer CAT corresponding to the open area OP may be defined as the second electrode CE. That is, the second electrode CE is the portions of the cathode layer CAT corresponding to the open area OP, wherein the cathode layer CAT is stacked on the emission layer EL as being one sheet over the whole area of the emission area AA of the substrate SUB.

The encapsulation layer EN may be stacked on the cathode layer CAT. The encapsulation layer EN is for protecting the emission element ED formed in the emission area AA. The encapsulation layer EN may include a single layered material, or a multiple layered material. In one example, the encapsulation layer EN may include a first inorganic layer, an organic layer on the first inorganic layer, and a second inorganic layer on the organic layer.

The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method.

The encapsulation layer EN may cover all emission area AA, and some of the non-emission area IA. However, the encapsulation layer EN may not cover the lower pad AT and the second pad CP to expose them.

On the encapsulation layer EN, a cover film CF may be disposed or attached. The cover film CF may be a thick film including metal material. In order to attach the cover film CF to the encapsulation layer EN, an adhesive FS may be used. The cover film CF may be attached as not covering the second pad CP to expose, but as covering the lower pad AT.

The electroluminescent lighting device according to the present disclosure has a feature in which the cover film CF is used for the routing line. FIGS. 1 and 2 show the case in which the cover film CF is used as the routing line for supplying the driving power voltage. For example, the conductive adhesive CA may be deposited as covering the lower pad AT exposed through the pad contact hole CH penetrating the passivation layer PAS. Therefore, the lower pad AT may be electrically connected to the cover film CF by the conductive adhesive CA.

When the cover film CF is made of metal material having superior conductivity such as copper (Cu) or aluminum (Al), the additional routing line may not be required. The cover film CF can be used for the routing line. In addition, some of the cover film CF may be used for the first pad AP. In FIGS. 1 and 2, the first pad AP is shown with the dotted line, because that some of the cover film CF is used for the first pad AP. In the case that it is not required for all of the cover film CF to have the conductive property, the other portions of the cover film CF excepting the first pad AP may be covered by an insulating film.

The second pad CP may be formed at the area not overlapping with the first pad AP in the non-emission area IA. For example, the second pad CP may be formed at the other side facing the first pad AP disposed in the first non-emission area IA1. The second pad CP may have a shape to be extended to the first non-emission area IA1 from the cathode layer CAT. In other example, the second pad CP may be formed of the same material and on the same layer as the lower pad AT extended to the auxiliary line AL. However, the second pad CP may be an electrical terminal for supplying the common voltage to the cathode layer CAT as having a shape separated from the lower pad AT.

In the interim, the electroluminescent lighting device according to one aspect of the present disclosure may further include a line contact hole LH. A plurality of line contact holes LH may be disposed at the other circumferences of cover film CF i.e., the second non-emission area IA2, the third non-emission area IA3 and the fourth non-emission area IA4. Like the pad contact hole CH, the line contact hole LH may expose some of the anode layer ANO covering the auxiliary line AL and be covered by the conductive adhesive CA. Therefore, the cover film CF may be electrically connected to the power line PL covering the auxiliary line AL through the conductive adhesive CA covering the line contact hole LH. As the anode layer ANO may receive the driving power voltage from the cover film CF, the electric power voltage may be uniformly distributed over the whole of the emission area AA. That is, even though there is no routing line, as the cover film CF is used for a routing structure having the sheet shape rather than line shape, the brightness may be uniformly distributed over the whole of the emission area AA.

Figure 3:
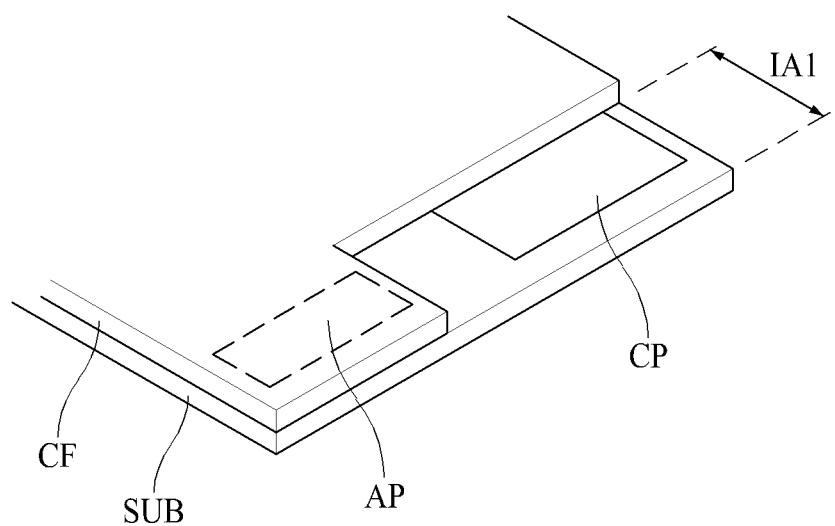
FIG. 3 is a diagram illustrating the electroluminescent lighting device having a pad structure according to a first aspect of the present disclosure.

Hereinafter, referring to figures, we will explain about various examples for the terminal structure implemented in the electroluminescent lighting device according to the present disclosure. At first, referring to FIG. 3, we will explain about the first aspect of the present disclosure. FIG. 3 is a diagram illustrating the electroluminescent lighting device having a pad structure according to the first aspect of the present disclosure.

Referring to FIG. 3, the structure of the pad according to the first aspect of the present disclosure is very similar as explained above. The first pad AP may be defined at one side end of the cover film CF. The first pad AP may be electrically connected to the lower pad AT disposed at the one side end of the first non-emission area IA1 of the substrate SUB through the conductive adhesive CA disposed under the bottom surface of the cover film CF. The whole surface of the cover film CF may be the first pad AP. In other case, depositing an insulating film on the cover film CF and forming an open-hole exposing some predetermined area, only some portions of the cover film CF may be defined as the first pad AP.

Further, the second pad CP may be disposed at another side end of the substrate SUB. The second pad CP may be disposed at another side end where the first pad AP is not disposed in the first non-emission area IA1 of the substrate SUB. The second pad CP may be formed of the cathode layer CAT. For another example, even though not shown in Figure, an auxiliary terminal may be further disposed under the second pad CP wherein the auxiliary terminal may include a first layer having an island shape separated from the auxiliary line AL and the lower pad AT but being made of the same material as the lower pad AT, and a second layer made of the anode layer ANO as covering the first layer.

Even though not shown in FIG. 3, but as shown in FIG. 1, a plurality of line contact holes LH may be further disposed at the other circumferences of the cover film CF i.e., the second non-emission area IA2, the third non-emission area IA3 and the fourth non-emission area IA4. Like the pad contact hole CH, the line contact hole LH may expose some of the anode layer ANO covering the auxiliary line AL and be covered by the conductive adhesive CA. Therefore, the cover film CF may be electrically connected to the power line PL covering the auxiliary line AL through the conductive adhesive CA covering the line contact hole LH. As the anode layer ANO may receive the driving power voltage from the cover film CF, the electric power voltage may be uniformly distributed over the whole of the emission area AA. Therefore, the brightness may be uniformly distributed over the whole of the emission area AA.

Figure 4:
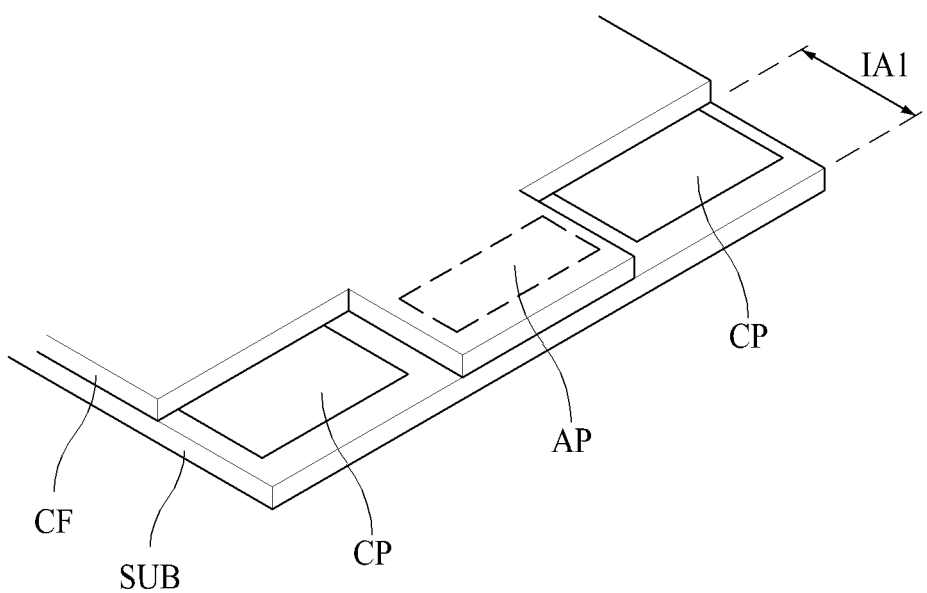
FIG. 4 is a diagram illustrating the electroluminescent lighting device having a pad structure according to a second aspect of the present disclosure.

Hereinafter, referring to FIG. 4, we will explain about the second aspect of the present disclosure. FIG. 4 is a diagram illustrating the electroluminescent lighting device having a pad structure according to the second aspect of the present disclosure.

Referring to FIG. 4, the pad structure according to the second aspect of the present disclosure may have a structure in which the first pad AP is disposed at the middle portion of the first non-emission area IA1, and one second pad CP is disposed at the left side of the first pad AP and the other second pad CP is disposed at the right side of the first pad AP. In detail, the first pad AP may be disposed at the middle portion of the one side end of the cover film CF. The first pad AP may be electrically connected to a lower pad (not shown) disposed at the middle portion of the first non-emission area IA1 of the substrate SUB by the conductive adhesive CA disposed at the bottom surface of the cover film CF. The whole surface of the cover film CF may be defined as the first pad AP. In other case, depositing an insulating film on the cover film CF and forming an open-hole exposing some predetermined area, only some portions of the cover film CF may be defined as the first pad AP.

The second pad CP may be disposed at both ends of the substrate SUB, respectively. The second pad CP may be disposed at both sides of the first pad AP in the first non-emission area IA1, respectively. The second pad CP may be made of the cathode layer CAT. For another example, the second pad CP may be connected to an auxiliary terminal. The auxiliary terminal may include a first layer and a second layer. The first layer may have an island shape separated from the auxiliary line AL and the lower pad AT but be made of the same material as the lower pad AT. The second layer may cover the first layer and be made of the anode layer ANO.

Even though not shown in FIG. 4, but as shown in FIG. 1, a plurality of line contact holes LH may be further disposed at the other circumferences of the cover film CF i.e., the second non-emission area IA2, the third non-emission area IA3 and the fourth non-emission area IA4. Like the pad contact hole CH, the line contact hole LH may expose some of the anode layer ANO covering the auxiliary line AL and be covered by the conductive adhesive CA. Therefore, the cover film CF may be electrically connected to the power line PL covering the auxiliary line AL through the conductive adhesive CA covering the line contact hole LH. As the anode layer ANO may receive the driving power voltage from the cover film CF, the electric voltage may be uniformly distributed over the whole of the emission area AA. Therefore, the brightness may be uniformly distributed over the whole of the emission area AA.

Figure 5:
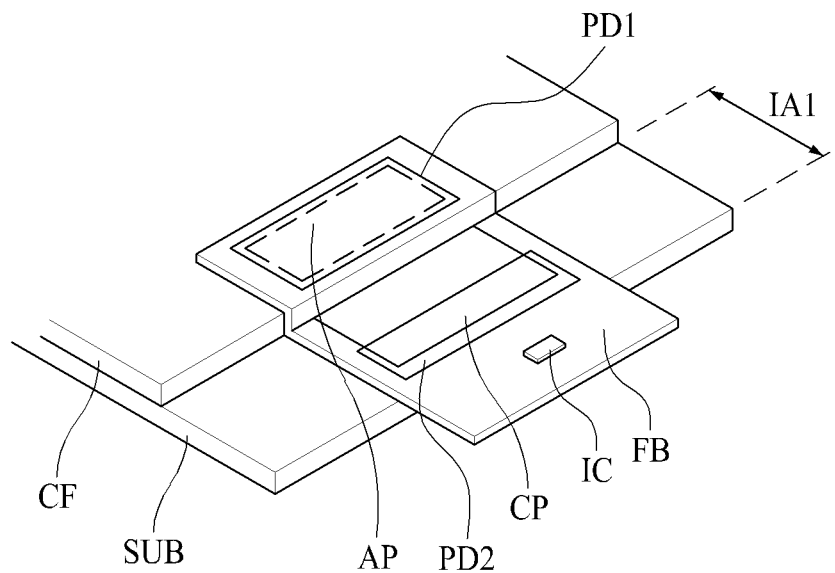
FIG. 5 is a diagram illustrating the electroluminescent lighting device having a pad structure according to a third aspect of the present disclosure.

Hereinafter, referring to FIG. 5, we will explain about the third aspect of the present disclosure. FIG. 5 is a diagram illustrating the electroluminescent lighting device having a pad structure according to the third aspect of the present disclosure.

Referring to FIG. 5, the pad structure according to the third aspect of the present disclosure may include a first pad AP defined at the middle portion of one end of the cover film CF, and the second pad CP disposed at the middle portion of one end of the substrate SUB. The first pad AP may be defined at a middle portion of the one side end of the cover film CF. The first pad AP may be electrically connected to a lower pad (not shown) disposed at the middle portion of the first non-emission area IA1 of the substrate SUB by the conductive adhesive CA disposed at the bottom surface of the cover film CF. The whole surface of the cover film CF may be the first pad AP. In other case, depositing an insulating film on the cover film CF and forming an openhole exposing some predetermined area, only some portions of the cover film CF may be defined as the first pad AP.

Further, the second pad CP may be disposed at the middle portion of the one side end of the substrate SUB. The second pad CP may be disposed at the middle area corresponding to the first pad AP in the first non-emission area IA1 of the substrate SUB. The second pad CP may be made of the cathode layer CAT. For another example, the second pad CP may be connected to an auxiliary terminal. The auxiliary terminal may include a first layer and a second layer. The first layer may have an island shape separated from the auxiliary line AL and the lower pad AT but be made of the same material as the lower pad AT. The second layer may cover the first layer and be made of the anode layer ANO.

Even though not shown in FIG. 5, but as shown in FIG. 1, a plurality of line contact holes LH may be further disposed at the other circumferences of the cover film CF i.e., the second non-emission area IA2, the third non-emission area IA3 and the fourth non-emission area IA4. Like the pad contact hole CH, the line contact hole LH may expose some of the anode layer ANO covering the auxiliary line AL and be covered by the conductive adhesive CA. Therefore, the cover film CF may be electrically connected to the power line PL covering the auxiliary line AL through the conductive adhesive CA covering the line contact hole LH. As the anode layer ANO may receive the driving power voltage from the cover film CF, the electric power voltage may be uniformly distributed over the whole of the emission area AA. Therefore, the brightness may be uniformly distributed over the whole of the emission area AA.

In the pad structure according to the third aspect of the present disclosure, when a flexible circuit board FB is equipped, the flexible circuit board FB may have a step shape. For example, the flexible circuit board FB may include a first pad terminal PD1, the second pad terminal PD2 and the driving device IC. The first pad terminal PD1 may be disposed at one side end of the flexible circuit board FB and connected to the first pad AP. The second pad terminal PD2 may be disposed on the flexible circuit board FB as corresponding to the second pad CP to connect to the second pad CP. In addition, the flexible circuit board FB may include the driving device IC for supplying or adjusting the driving signal, the driving voltage and the common voltage to the first pad terminal PD1 and the second pad terminal PD2.

With an anisotropy conductive film between the first pad terminal PD1 of the flexible circuit board FB and the first pad AP of the cover film CF, they may be electrically connected each other. In addition, the second pad terminal PD2 of the flexible circuit board FB may be electrically connected to the second pad CP of the substrate SUB with an anisotropy conductive film.

Figure 6:
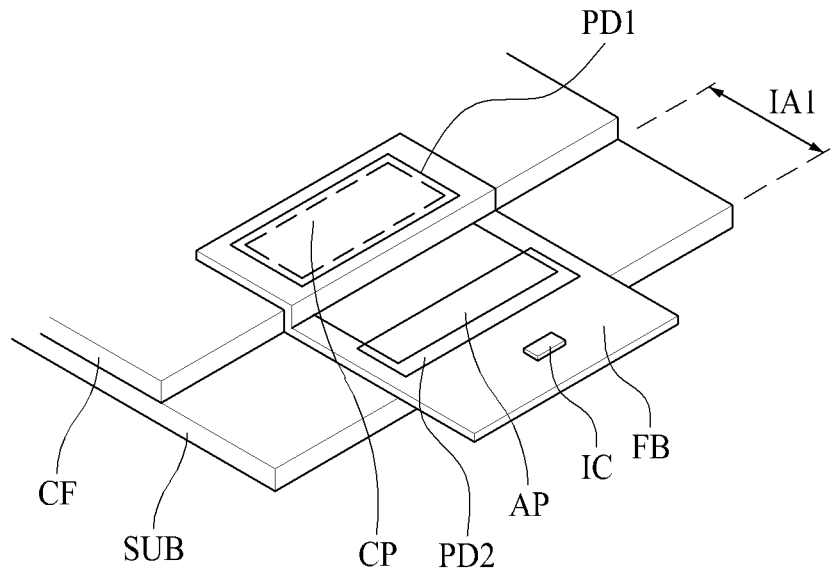
FIG. 6 is a diagram illustrating the electroluminescent lighting device having a pad structure according to a fourth aspect of the present disclosure.

Hereinafter, referring to FIG. 6, we will explain about the fourth aspect of the present disclosure. FIG. 6 is a diagram illustrating the electroluminescent lighting device having a pad structure according to the fourth aspect of the present disclosure.

Referring to FIG. 6, the pad structure according to the fourth aspect of the present disclosure may be very similar with that of the third aspect. The different feature may be that the first pad AP is disposed on the substrate SUB, and the second pad CP is disposed on the cover film CF. The duplicated explanation for other elements will be omitted.

The cathode layer CAT may include a metal material and be disposed on the whole of the emission area AA. Therefore, the common voltage can be uniformly supplied to the cathode layer CAT without any voltage differences due to the differences of the resistance according to the positions. The power line PL may be made of a transparent conductive material having the relatively higher resistance than the metal material. In this case, especially when the emission area AA is getting larger, the driving voltages over the emission area AA may not be uniformly distributed due to the differences of sheet resistance.

To prevent this problem, the auxiliary line AL made of metal material is further included. However, for manufacturing the lighting device providing uniform brightness to the large area or space, it may be hard to keep the sheet resistance of the anode layer ANO in being uniformly distributed over the large emission area with only the auxiliary line AL. In that case, applying a metal film having relatively low resistance such as copper or aluminum to the cover film CF, the sheet resistance of the anode layer ANO may be further lowered.

In the first to third aspects explained above, in order to reduce the sheet resistance of the anode layer ANO having the transparent conductive material of which resistance is higher than metal material, the cover film CF is used for the first pad AP, and the cover film CF and the anode layer ANO are physically connected each other over the whole of the non-emission area IA. However, in some cases, it is further required to reduce the sheet resistance of the cathode layer CAT. For example, a metal material may be applied to the anode layer ANO, and a transparent conductive material may be applied to the cathode layer CAT. In this case, in order to reduce the sheet resistance of the cathode layer CAT, it may be required to connect the cathode layer CAT with the cover film CF. The fourth aspect provides the structure in which the cathode layer CAT is connected to the cover film CF.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent lighting device comprising:
   a substrate including an emission area and a non-emission area surrounding the emission area;
   an auxiliary line disposed at the emission area and defining a pixel area;
   a lower pad extended from the auxiliary line and disposed at one side of the non-emission area;
   an anode layer covering the auxiliary line and the lower pad;
   an emission layer disposed on the anode layer in the emission area;
   a cathode layer disposed on the emission layer;
   a second pad extended from the cathode layer and disposed at another side of the non-emission area;
   an encapsulation layer covering the emission area on the cathode layer;
   a cover film attached on the encapsulation layer and having a first pad corresponding to the lower pad; and a conductive adhesive electrically connecting the first pad and the lower pad.

2. The device according to claim 1, further comprising:
a plurality of line contact holes located at the non-emission area where the lower pad is not disposed and exposing the anode layer,
wherein the conductive adhesive electrically connects the anode layer and the cover film through the plurality of the line contact holes.

3. The device according to claim 1, wherein the first pad is disposed at middle portions of one side of the cover film, and the second pad is disposed at middle portions corresponding to the first pad on the substrate.

4. The device according to claim 3, further comprising a flexible circuit board including a first pad terminal connected to the first pad, a second pad terminal connected to the second pad, and a driving device connected to the first pad terminal and the second pad terminal.

5. The device according to claim 1, wherein the anode layer includes:
a power line contacting and covering the auxiliary line;
a first electrode connected to the power line and formed in the pixel area; and
a link electrode having a rod shape connecting the first electrode to the power line.

6. The device according to claim 5, further comprising a passivation layer deposited on the anode layer and covers the power line and the link electrode, and
wherein the passivation layer defines a pixel emitting area by covering circumferences of the first electrode and exposing middle portions of the first electrode.

7. The device according to claim 6, wherein the first electrode, the emission layer and the cathode layer stacked in the pixel emitting area constitute an emission element.

8. The device according to claim 1, wherein the first pad is disposed at one end of the one side of the non-emission area, and
wherein the second pad is separated apart from the first pad with a predetermined distance and disposed at another end of the one side of the non-emission area.

9. The device according to claim 1, wherein the first pad is disposed at a middle portion of the one side of the non-emission area, and
wherein the second pad is disposed at both sides of the first pad at the one side of the non-emission area.

10. The device according to claim 1, further comprising a non-conductive adhesive disposed at the emission area for attaching the encapsulation layer to the cover film.

11. An electroluminescent lighting device comprising:
a substrate including an emission area and a non-emission area surrounding the emission area;
an auxiliary line disposed at the emission area and defining a pixel area;
a lower pad extended from the auxiliary line and disposed at one side of the non-emission area;
a second pad disposed at another side of the non-emission area;
an encapsulation layer covering the emission area;
a cover film attached on the encapsulation layer and having a first pad corresponding to the lower pad;
a conductive adhesive electrically connecting the first pad and the lower pad; and
a flexible circuit board including a first pad terminal connected to the first pad, a second pad terminal connected to the second pad and a driving device connected to the first pad terminal and the second pad terminal.

12. The device according to claim 11, further comprising an anode layer covering the auxiliary line and the lower pad.

13. The device according to claim 12, further comprising an emission layer disposed on the anode layer in the emission area and a cathode layer disposed on the emission layer.

14. The device according to claim 11, further comprising:
a plurality of line contact holes located at the non-emission area where the lower pad is not disposed and exposing the anode layer,
wherein the conductive adhesive electrically connects the anode layer and the cover film through the plurality of the line contact holes.

15. The device according to claim 11, wherein the first pad is disposed at middle portions of the one side of the cover film, and the second pad is disposed at middle portions corresponding to the first pad on the substrate.

16. The device according to claim 11, wherein the anode layer includes:
a power line contacting and covering the auxiliary line;
a first electrode connected to the power line and formed in the pixel area; and
a link electrode having a rod shape connecting the first electrode to the power line.

17. The device according to claim 16, further comprising a passivation layer deposited on the anode layer and covers the power line and the link electrode, and
wherein the passivation layer defines a pixel emitting area by covering circumferences of the first electrode and exposing middle portions of the first electrode.

18. The device according to claim 11, wherein the first pad is disposed at one end of the one side of the non-emission area, and
wherein the second pad is separated apart from the first pad with a predetermined distance and disposed at another end of the one side of the non-emission area.

19. The device according to claim 11, wherein the first pad is disposed at a middle portion of the one side of the non-emission area, and
wherein the second pad is disposed at both sides of the first pad at the one side of the non-emission area.

20. The device according to claim 11, further comprising a non-conductive adhesive disposed at the emission area for attaching the encapsulation layer to the cover film.

* * * * *